United States Patent
Ohashi et al.

(10) Patent No.: US 6,430,042 B1
(45) Date of Patent: Aug. 6, 2002

(54) ELECTRONIC APPARATUS HAVING MEANS FOR COOLING A SEMICONDUCTOR ELEMENT MOUNTED THEREIN

(75) Inventors: Shigeo Ohashi, Tsuchiura; Yoshihiro Kondo; Takashi Naganawa, both of Chiyoda; Tsuyoshi Nakagawa, Hadano, all of (JP)

(73) Assignee: Hitachi, Ltd., Tokyo (JP)

( * ) Notice: Subject to any disclaimer, the term of this patent is extended or adjusted under 35 U.S.C. 154(b) by 27 days.

(21) Appl. No.: 09/653,584

(22) Filed: Aug. 31, 2000

(30) Foreign Application Priority Data

Mar. 17, 2000 (JP) ........................................ 2000-081755

(51) Int. Cl.⁷ ................................................ H05K 7/20
(52) U.S. Cl. .................... 361/687; 361/692; 361/695; 454/184; 165/104.33; 312/223.1
(58) Field of Search ....................... 361/683, 685–695, 361/704, 707–722, 725–732; 454/184; 62/418, 259.2; 312/223.1, 208.1, 223.2, 208.4, 236; 364/708.1; 165/80.3, 122–126, 104.32, 104.33

(56) References Cited

U.S. PATENT DOCUMENTS

| | | | | |
|---|---|---|---|---|
| 5,313,362 A | * | 5/1994 | Hatada et al. | 361/709 |
| 5,535,094 A | * | 7/1996 | Nelson et al. | 361/697 |
| 5,557,500 A | * | 9/1996 | Baucom et al. | 361/687 |
| 5,689,403 A | * | 11/1997 | Robertson et al. | 361/695 |
| 5,694,294 A | * | 12/1997 | Ohashi et al. | 361/687 |
| 5,748,444 A | * | 5/1998 | Honda et al. | 361/687 |
| 5,898,567 A | * | 4/1999 | Satake | 361/687 |
| 6,049,455 A | * | 4/2000 | Nakamura et al. | 361/688 |
| 6,072,696 A | * | 6/2000 | Horii | 361/695 |
| 6,134,104 A | * | 10/2000 | Mohi et al. | 361/683 |
| 6,141,218 A | * | 10/2000 | Miyahara | 361/695 |
| 6,205,025 B1 | * | 3/2001 | Chen | 361/704 |
| 6,210,134 B1 | * | 4/2001 | Miyahara | 417/423.14 |
| 6,226,180 B1 | * | 5/2001 | Ueda et al. | 361/689 |
| 6,239,971 B1 | * | 5/2001 | Yu et al. | 361/695 |
| 6,253,834 B1 | * | 7/2001 | Sterner | 165/80.3 |
| 6,266,243 B1 | * | 7/2001 | Tomioka | 361/695 |
| 6,288,895 B1 | * | 9/2001 | Bhatia | 361/687 |

FOREIGN PATENT DOCUMENTS

| | | | | |
|---|---|---|---|---|
| JP | 409319465 A | * | 12/1997 | G06F/1/20 |
| JP | 410303580 A | * | 11/1998 | H05K/7/20 |
| JP | 411039063 A | * | 2/1999 | G06F/1/20 |
| JP | 02000227820 A | * | 8/2000 | G06F/1/20 |

* cited by examiner

*Primary Examiner*—Darren Schuberg
*Assistant Examiner*—Michael Datskovsky
(74) *Attorney, Agent, or Firm*—Antonelli, Terry, Stout & Kraus, LLP

(57) ABSTRACT

An electronic apparatus comprises a semiconductor element mounted inside a housing, a keyboard fitted to the housing, a heat radiating member provided on one face of the semiconductor element and a thermal conductive duct provided on the other face of the element. The electronic apparatus further comprises a wall thermally connecting an upper wall and a lower wall of the duct. The duct is provided with a fan.

6 Claims, 5 Drawing Sheets

ELECTRONIC APPARATUS HAVING MEANS FOR COOLING A SEMICONDUCTOR ELEMENT MOUNTED THEREIN

BACKGROUND OF THE INVENTION

The present invention relates to an electronic apparatus equipped with a device for cooling semiconductor elements in a housing.

In recent years, a portable-type electronic apparatus, what is called, personal computer (hereinafter, referred to as PC) has a problem of a temperature rise due to the heat generated from a semiconductor element in the housing with advance of speedup and mini-size weight-lightening.

An example of cooling means for the semiconductor element has been disclosed in JP-A-10-303580 specification. This prior art sucks the outside atmosphere into a duct in the housing from the keyboard side by the rotation of a fan and exhausts it outside the housing after thermally exchanging the heat from semiconductor elements in contact with the duct for the air taken from the outside atmosphere.

Regarding the cooling of a semiconductor element generating high heat, it is desirable to radiate heat to outside of the housing by increasing the flow rate of the cooling air circulating in the duct like the above prior art. However, when an amount of heat generation of the element becomes high, the cooling only by the duct becomes insufficient even if the flow rate of the cooling air is increased. Therefore, there is need to conduct the heat to the housing to supplement the heat radiation.

Meanwhile, in recent years, a spread of mobiles has increased the use of a PC in vehicles such as an electric train or at a user's destination. Especially, in vehicles without any space needed for placing a PC, cases where the PC is manipulated on the user's knees are increasing. Thus, when the heat of semiconductor elements is so arranged as to conduct to the housing, there is a possibility that the bottom face of the housing is heated and thus the PC cannot be placed on the knees.

Indeed, in the above-described prior art, no thermal conduction is made to the housing and the bottom face of the PC is not heated. However, when a semiconductor element generating high heat amount is employed, the heat radiation amount becomes insufficient for heat radiation only through the duct and therefore heat radiation to the housing becomes necessary. If the heat of the semiconductor element is radiated to the housing in the above prior art, there is a possibility that the bottom face of the PC becomes hot.

It is an object of the present invention to provide an electronic apparatus in particular preventing the bottom face of the housing from becoming hot by efficiently cooling a semiconductor element.

SUMMARY OF THE INVENTION

According to the present invention, there is provided an electronic apparatus comprising a semiconductor element mounted inside a housing, a keyboard fitted to the housing, a heat radiating member provided on one face of the semiconductor element and a thermal conductive duct provided on the other face of the element.

According to the present invention, there is provided an electronic apparatus comprising a semiconductor element mounted inside a housing, a keyboard fitted to the housing, a first thermal conductive member connected to the semiconductor element at a keyboard side, a thermal conductive duct connected to the first thermal conductive member and provided on a rear side of the keyboard, a second thermal conductive member connected to the semiconductor element at a bottom side of the housing and a heat radiating member connected to the second thermal conductive member and provided in the housing at a bottom side.

According to the present invention, there is provided an electronic apparatus comprising a semiconductor element mounted inside a housing, a keyboard fitted to the housing, a first thermal conductive member connected to the semiconductor element at a keyboard side, a heat radiating member connected to the first thermal conductive member and provided on a rear side of the keyboard, a second thermal conductive member connected to the semiconductor element at a bottom side of the housing and a thermal conductive duct connected to the second thermal conductive member and comprising a fan provided on the bottom side of the housing.

According to the present invention, there is provided an electronic apparatus comprising a semiconductor element mounted inside a housing, a keyboard fitted to the housing, a heat radiating path for elevating the temperature of a thermal conductive duct provided at a rear side of the keyboard higher than the temperature of a heat radiating member provided at a bottom side of the housing.

According to the present invention, there is provided an electronic apparatus comprising a semiconductor element mounted inside a housing, a keyboard fitted to the housing, a heat radiating path for making the temperature of the thermal conductive duct provided at a rear side of the keyboard lower than the temperature of a heat radiating member provided at a bottom side of the housing.

It is preferable to provide a wall thermally connecting an upper wall and a lower wall of the duct.

Preferably, the duct is provided with a fan.

DESCRIPTION OF THE EMBODIMENTS

Figure 1:
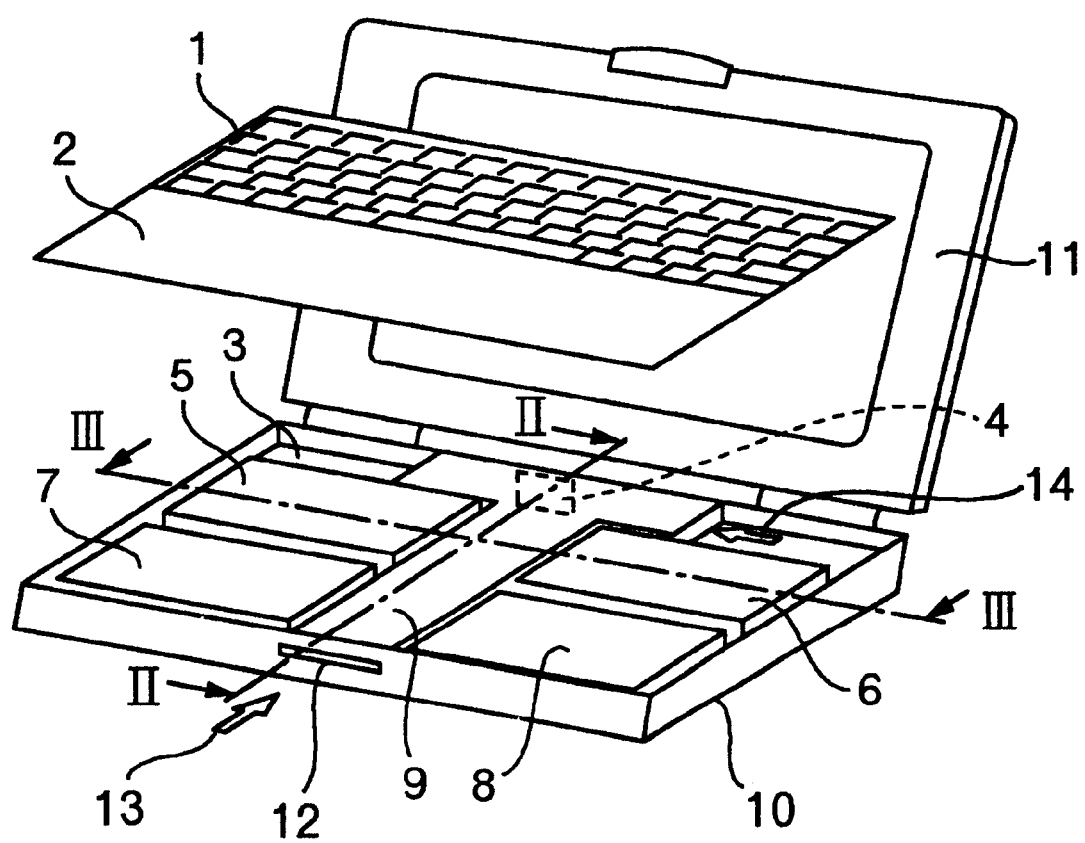
FIG. 1 is a perspective view of a first embodiment of an electronic apparatus according to the present invention.
Figure 2:
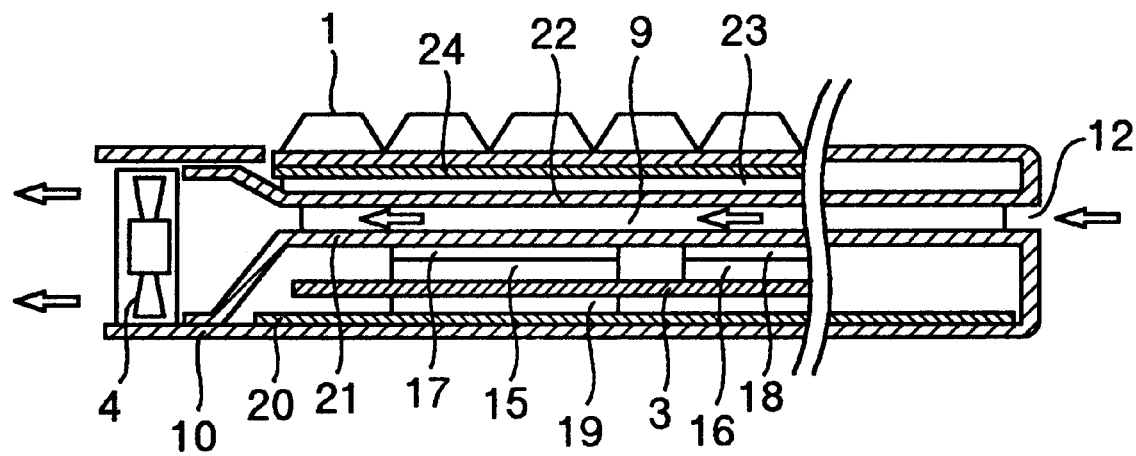
FIG. 2 is a sectional view taken along a line II—II in FIG. 1.
Figure 3:
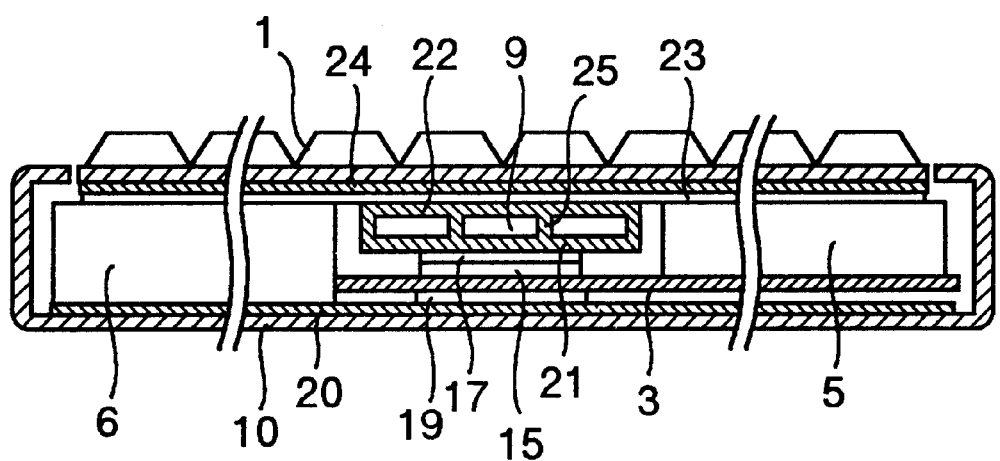
FIG. 3 is a sectional view taken along a line III—III in FIG. 1.

Referring to FIGS. 1 to 3, a first embodiment of an electronic apparatus according to the present invention will be described.

In FIG. 1, reference numerals 1 and 2 denote a keyboard and a palm rest, both of which are positioned on substantially the same plane. The palm rest 2 is a part convenient for PC user's manipulation of the keyboard 1 with the wrist placed thereon. Positioned below the keyboard 1 and the palm rest 2 are a wiring substrate 3 with a plurality of central processing units (in particular, units generating high heat amount, referred to as CPU hereinafter), a hard disk drive 5, an auxiliary storage unit (e.g., floppy drive or the like) 6, a CD-ROM drive 7, a battery 8 and so on. Reference numeral 9 denotes a duct for flowing cooling air supplied by a fan 4. The duct 9 is positioned below the keyboard 1 and the palm rest 2 and installed either between the hard disc drive 5 and the auxiliary storage unit 6 or between the CD-ROM drive 7 and the battery 8. At one end of the duct 9, the fan 4 is positioned. The other end of the duct 9 is opened outside of a housing. Reference numerals 10 and 11 denote the housing for containing these electronic parts and a display part pivotally mounted to the housing 10 through a hinge. Reference numeral 12 denotes an air suction port provided on a wall of the housing 10 and is communicated with the duct 9. The portion at which the air suction port 12 is provided and the portion at which an air exhaust port in which the fan 4 is provided respectively correspond to a front side and a rear side of the housing 10. Reference numerals 13 and 14 denote the air to be sucked into the duct 9 and the heated air inside the housing 10.

By the rotation of the fan 4, air 13 of the outside atmosphere is sucked into the duct 9 from the suction port 12 and exhausted from the exhaust port at the rear side of the housing 10. Furthermore, the heated air 14 in the housing 10 is also sucked into the duct 9. Arrangement and a shape of the duct 9 are determined depending on the shape and layout of electronic parts to be mounted in the housing 10.

As shown in FIG. 2, the CPU 15 and other heat generating elements 16 are mounted on the wiring substrate 3. The duct 9 is situated above the wiring substrate 3 and installed below the keyboard 1. The duct 9 is formed of a highly heat conductive metal such as aluminum. One end of the duct 9 is communicated with the suction port 12 and the other end is connected to the exhaust port equipped with the fan 4 at the rear side of the housing 10. By the rotation of the fan 4, the outside atmosphere is sucked from the suction port 12, is made to flow through a space between an upper and a lower wall 22 and 21 forming the duct 9 and is exhausted from the exhaust port. The duct portion with the fan 4 fitted is enlarged in the shape of a trumpet and shaped almost identical in diameter with the fan 4.

The CPU 15 is connected to the lower wall 21 of the duct 9 via an elastic heat conducting member (for example, Si rubber with a filler such as aluminum oxide mixed) 17. Similarly, other heat generating elements 16 are also connected to the lower wall 21 of the duct 9 through an elastic heat conducting member 18. On the other hand, connected to the upper wall 22 of the duct 9 is a base plate 24 of the keyboard 1 via an elastic heat conducting member 23. The base plate 24 of the keyboard 1 is made of metal (such as aluminum or the like) and acts as a heat radiating plate also.

Fitted to a bottom of the housing 10 is a heat radiating plate 20 almost equal in area to the bottom. In order to enlarge a thermal conduction area, the heat radiating plate 20 is desired to have the largest possible area. Besides, by molding the housing 10 itself with highly heat conducting material such as Mg alloy, the bottom of the housing 10 can be utilized as the heat radiating plate 20. Since a heat conducting member (not shown) for conducting the heat of the CPU 15 to a rear face of the wiring substrate is provided on the wiring substrate 3 so as to pierce the substrate 3, the heat of the CPU 15 is conducted via the elastic heat conducting member 19 to the heat radiating plate 20 on the bottom of the housing 10. Thus, for the heat of the CPU 15, a heat radiating path is formed on both of the upper side (keyboard side) and the bottom side of the housing 10. The heat radiating path on the bottom side may be omitted or simplified (e.g., no elastic heat conducting member 19 is fitted) depending on the heat generating amount of the CPU 15. Besides, other heat generating elements 16 may be also thermally connected to the heat radiating plate 20 on the bottom side via the elastic heat conducting member.

As shown in FIG. 3, the duct 9 is flat-shaped by using a space between the hard disc drive 5 and the auxiliary storage unit 6. The shape may be determined depending on the size or layout of parts mounted, but using the space between the mounted parts is effective and can suppress an increase in the size of the housing. Thus, in the present embodiment, a straight duct is provided at a center of the housing, but the duct may be the form of an L-shaped or S-shaped curved flow path.

The duct 9 has the space formed by the upper and lower walls 22 and 21 partitioned into a plurality of flow paths side by side by vertical walls 25, but may be in the shape of a single rectangle having only two vertical side walls. Since the upper and lower walls 22 and 21 are thermally connected by the vertical walls 25, the heat generated by the CPU 15 and other elements 16 is conducted from the lower wall 21 to the upper wall 22 of the duct 9. Furthermore, since the vertical walls 25 in plural are provided in the duct 9, the heat radiating area in the duct 9 is enlarged and the heat from the CPU 15 and other heat generating elements 16 is well radiated.

The heat generated by the CPU 15 and other heat generating elements 16 is thermally conducted via the respective connected elastic heat conducting members 17 and 18 to the lower wall 21 of the duct 9. In the duct 9, air is made to flow by the fan 4 and part of the heat conducted to the lower wall 21 is thermally exchanged for the air flowing in the duct. Since the walls 21, 22 and 25 of the duct 9 are made of a highly heat conducting material, the thermal diffusion is performed in the duct walls and the heat exchange with the air in the duct becomes efficient.

On the other hand, the heat not exchanged for the air in the duct 9 is conducted to the base plate 24 of the keyboard 1 from the upper wall 22 via the elastic heat conducting member 23, further thermally diffused in the base plate 24 and thereafter radiated from the surface of the keyboard 1 to the outside atmosphere. Besides, the heat of the CPU 15 is radiated from the housing bottom via the heat radiating plate 20 on the bottom of the housing 10.

In this manner, the heat from the CPU 15 and other heat generating elements 16 is thermally exchanged for the air flowing in the duct 9 by the fan and the thermally unexchanged heat is naturally radiated from the housing surface and conducted to the keyboard side and the housing bottom side via elastic heat conducting members, so that the thermal conduction to the housing bottom side is especially suppressed because the main cooling is performed by a fan cooling even when the temperature of the elements becomes higher.

Since the present invention employs a duct equipped with a fan, there is no inflow air not contributing to the cooling of elements and all the inflow air can be used to cool the heat generating elements. Thus, the cooling efficiency is enhanced.

Other embodiments of the invention will be described with reference to FIGS. 4 to 8.

Figure 4:
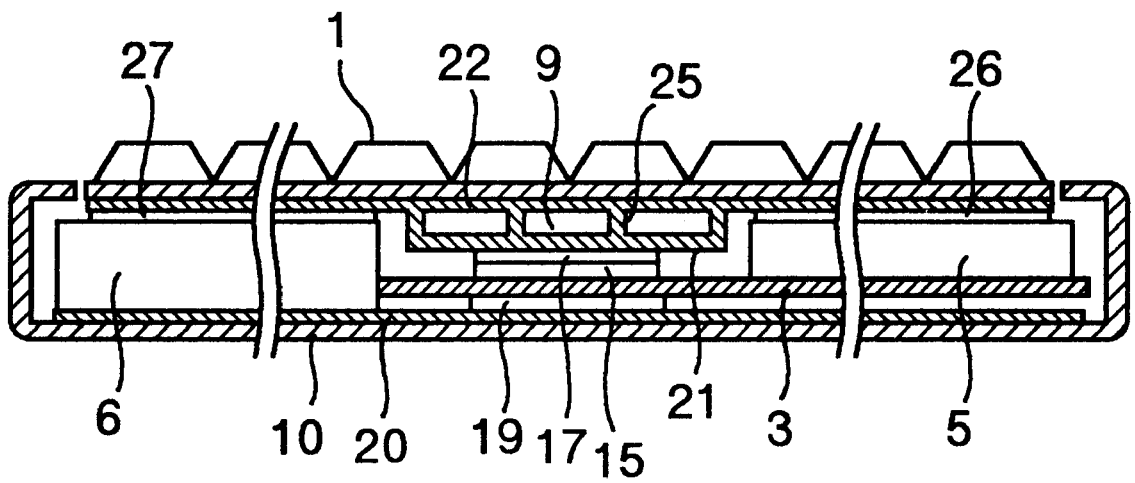
FIG. 4 is a sectional view of a second embodiment of the invention, equivalent to FIG. 3.

In a second embodiment shown in FIG. 4, the base plate 24 of the keyboard 1 of the first embodiment shown in FIGS. 1 to 3 is substituted with the upper wall 22 of the duct 9. Namely, in the second embodiment, the upper wall 22 forming the duct 9 is made substantially equal in area to the keyboard 1 and the hard disc drive 5 and the auxiliary storage unit 6 are connected to an inner face of the upper wall 22 via elastic heat conducting members 26 and 27. The structure except the upper wall 22 is identical with that of the first embodiment shown in FIGS. 1 to 3.

According to the second embodiment, since the heat diffusion effected in a base portion of the keyboard 1 can be speedily performed in the upper wall 22 of the duct 9 in contrast to the first embodiment, the efficiency of heat radiation from the keyboard surface side rises. Furthermore, the heat of the hard disk drive 5 and the auxiliary storage unit 6 can be also thermally radiated by the heat exchange for the air flowing in the duct 9 through aids of the thermal diffusion in the upper wall 22.

Figure 5:
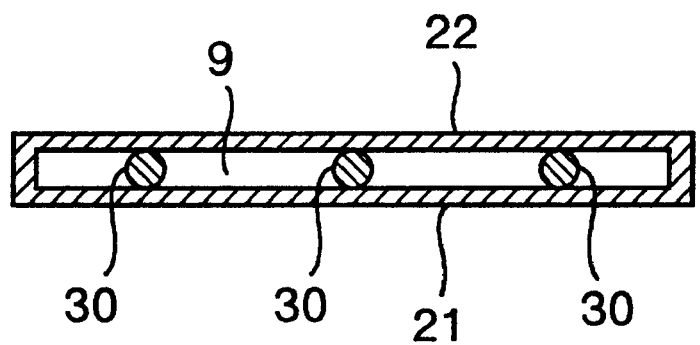
FIG. 5 is an enlarged sectional view of a duct of a third embodiment of the invention.

In a third embodiment shown in FIG. 5, one or more heat pipes 30 are provided between the lower wall 21 and the upper wall 22 of the duct 9 to thermally connect the lower wall 21 and the upper wall 22 via the heat pipes 30. A connection of the upper and lower walls 22 and 21 to the heat pipes 30 is desirably made over the whole length in the longitudinal direction of the heat pipes 30. These heat pipes may be caulked to the upper and lower walls 22 and 21, or may be fixed with highly heat conducting adhesive.

According to the third embodiment, the thermal conduction from the lower wall 21 to the upper wall 22 can be efficiently performed by means of the heat pipes 30 and the heat conducted to the lower wall 21 is conducted to the upper wall 22 with a small thermal resistance. Furthermore, since the thermal diffusion in the longitudinal direction of the duct 9 is speedily performed and moreover the surface area in the duct 9 is enlarged by the heat pipes 30 themselves, a heat exchange with the air in the duct 9 can be efficiently made.

Figure 6:
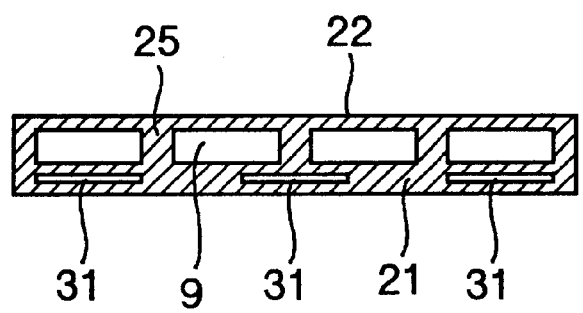
FIG. 6 is an enlarged sectional view of a duct of a fourth embodiment of the invention.

In a fourth embodiment shown in FIG. 6, flat-shaped heat pipes 31 are provided on one or both of the upper and lower walls 22 and 21 of the duct 9, thereby enabling a thermal diffusion to be speedily made especially in the longitudinal direction of the duct 9. In the fourth embodiment, flat-shaped heat pipes 31 are embedded in at least one of the upper and lower walls 22 and 21, but the duct walls 21 and 22 may be formed of flat-shaped heat pipes 31 themselves. By use of flat-shaped heat pipes 31, a thermal diffusion in the duct walls can be enhanced while suppressing the duct itself low in height, so that an improvement in the efficiency of heat radiation can be achieved without thickening the housing.

Figure 7:
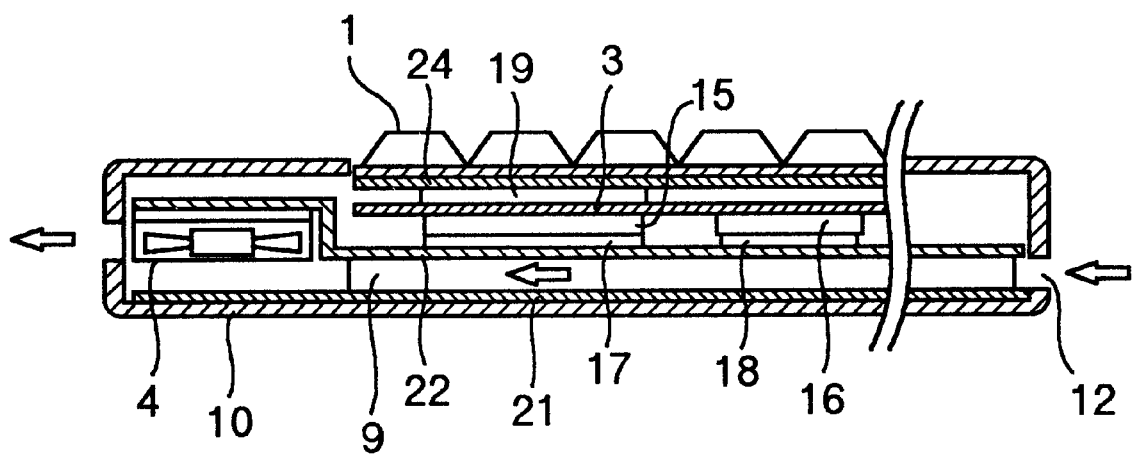
FIG. 7 is a sectional view of a fifth embodiment of the invention, equivalent to FIG. 2.

In a fifth embodiment shown in FIG. 7, the size of the lower wall 21 forming the flat duct 9 is almost equal to the bottom area of the housing 10 and the lower wall 21 is so arranged as to serve for the heat radiating plate 20 of the first embodiment shown in FIGS. 1 to 3 and the rotating direction of the fan 4 is set to the horizontal direction. Except for the duct 9 and the fan 4, the structure is much the same as with the first embodiment shown in FIGS. 1 to 3.

The duct 9 formed of a highly heat conducting metal such as aluminum is installed between the wiring substrate 3 and the bottom of the housing 10, one end of which is communicated with the suction port 12 provided on the front side of the housing and the other end of which is equipped with the fan 4. Since the rotating direction of the fan 4 is horizontal, a fan 4 having a diameter of more than the thickness of the housing 10 can be mounted. The suction part of the fan 4 faces the flow path in the duct 9 and the inside air is exhausted from the flank of the fan 4 to outside of the housing 10. The whole air flow rate of the fan 4 is so arranged as to pass through the duct 9. The CPU 15 and other elements are respectively connected to the upper wall 22 of the duct 9 via the elastic heat conducting members 17 and 18. On the other hand, the lower wall 21 of the duct 9 in contact with the bottom of the housing 10 is desirably as great in area as possible. Besides, by molding the housing 10 itself out of highly heat conducting material such as Mg alloy, the lower wall 21 may be jointly used for the housing 10. The CPU 15 is thermally connected to the keyboard base plate 24 also via the wiring substrate 3 and the elastic heat conducting member 19.

Figure 8:
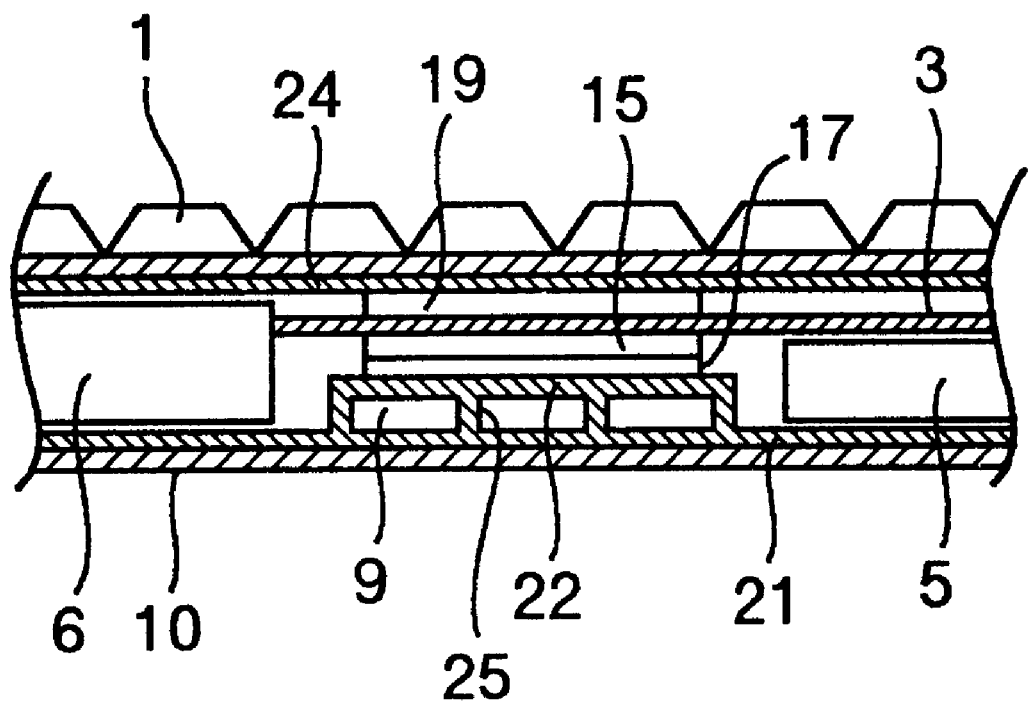
FIG. 8 is a partially sectional view of a sixth embodiment of the invention, equivalent to FIG. 3.

In a sixth embodiment shown in FIG. 8, the duct 9 has the space formed by the upper and lower walls 22 and 21 partitioned by vertical walls 25 into multiple flow paths. By the vertical walls 25, the upper and lower walls 22 and 21 are thermally connected. Thereby, the heat of the CPU 15 and other heat generating elements 16 is conducted from the upper wall 22 to the lower wall 21 of the duct 9. In the duct 9, air is made to flow by means of the fan 4, and most of the heat thermally conducted to the upper wall 22 is thermally exchanged for the air in the duct and the heated air is exhausted to outside of the housing 10. With respect to the duct 9, since walls 21, 22 and 25 are made of a highly heat conducting material, a thermal diffusion is performed in the duct walls and the heat in them is thermally exchanged for the air in the duct efficiently. On the other hand, the heat not exchanged with the air in the duct 9 is radiated from the lower wall 21 to the outside atmosphere via the housing bottom. Besides, the heat of the CPU 15 is radiated also from the surface of the keyboard 1. Heat radiation of the CPU 15 and other heat generating elements 16 is carried out through the thermal exchange for the air flowing in the duct 9 and the natural radiation from the housing surface, thereby reducing the load imposed on the fan cooling.

In this manner, according to the present invention, the heat generated from a semiconductor element in a housing of an electronic apparatus is conducted to duct walls via a heat radiating material connected to the semiconductor element. In the duct, since air is made to flow by means of a fan, part of the heat from an element is exhausted to outside of the housing through the air flowing in the duct. On the other hand, since the walls of a duct are made of a highly heat conducting material, a thermal diffusion is performed in the duct walls, a duct inner wall surface serves for heat radiating surface, cooling is efficiently accomplished by the air flowing in the duct and most of the heat of the semiconductor element is cooled by means of the duct.

On the other hand, since the heat not cooled by the air in the duct is thermally conducted via duct walls to an inner wall surface of the housing or to the heat radiating plate provided behind the keyboard and is thermally diffused in the heat radiating plate and is naturally radiated from the housing surface, thermal conduction to the keyboard side and the bottom face side of the housing is little. Especially, the bottom face of the housing does not become hot, thereby resulting in an advantage that a user feels no heat in his knees even if placing a PC on his knees.

According to the present invention, electronic elements are efficiently cooled, thereby making it possible to provide an electronic apparatus with the bottom of a housing prevented from becoming hot.

What is claimed is:

1. An electronic apparatus comprising: a housing; a keyboard fitted to the housing; a semiconductor element mounted inside the housing; a first thermal conductive member connected to the semiconductor element at a keyboard side thereof; a second thermal conductive member connected to the semiconductor element at a bottom side thereof opposite the keyboard side; a first heat radiating member provided on a rear side of the keyboard; a second heat radiating member provided on a bottom of the housing and thermally connected with the second thermal conductive member connected to the semiconductor element; and a thermal conductive duct, one wall of which is thermally connected with the first heat radiating member provided on the rear side of the keyboard and an opposite wall of which is thermally connected with the first thermal conductive member connected to the semiconductor element, wherein a part of heat generated by the semiconductor element is radiated by the thermal conductive duct and the remainder of the heat generated by the semiconductor element is radiated from the second heat radiating member provided on the bottom of the housing and the first heat radiating member provided on the rear side of the keyboard.

2. An electronic apparatus according to claim 1, wherein said thermal conductive duct includes a wall portion for thermally interconnecting the walls of said duct and a fan for introducing ambient air into said duct.

3. An electronic apparatus comprising: a housing; a keyboard fitted to the housing; a semiconductor element mounted inside the housing; a first thermal conductive member connected to the semiconductor element at a keyboard side thereof; a second thermal conductive member connected to the semiconductor element at a bottom side thereof opposite the keyboard side; a first heat radiating member provided on a rear side of the keyboard and thermally connected with the first thermal conductive member connected to the semiconductor element; and a thermal conductive duct, one wall of which is thermally connected with the second thermal conductive member connected to the semiconductor element and an opposite wall of which is thermally connected with a bottom of the housing, wherein a part of heat generated by the semiconductor element is radiated by the thermal conductive duct and the remainder of the heat generated by the semiconductor element is radiated from the bottom of the housing and the first heat radiating member provided on the rear surface of the keyboard.

4. An electronic apparatus according to claim 3, wherein said thermal conductive duct includes a wall portion for thermally interconnecting the walls of said duct and a fan for introducing ambient air into said duct.

5. An electronic apparatus according to claim 1, wherein a main part of the heat generated by the semiconductor element is radiated by the thermal conductive duct.

6. An electronic apparatus according to claim 3, wherein a main part of the heat generated by the semiconductor element is radiated by the thermal conductive duct.

* * * * *